(12) United States Patent
Shih

(10) Patent No.: US 6,951,793 B2
(45) Date of Patent: Oct. 4, 2005

(54) LOW-TEMPERATURE POLYSILICON THIN FILM TRANSISTOR HAVING BURIED LDD STRUCTURE AND PROCESS FOR PRODUCING SAME

(75) Inventor: An Shih, Changhua (TW)

(73) Assignee: Toppoly Optoelectronics Corp., Miao-Li (TW)

( * ) Notice: Subject to any disclaimer, the term of this patent is extended or adjusted under 35 U.S.C. 154(b) by 0 days.

(21) Appl. No.: 10/855,542

(22) Filed: May 27, 2004

(65) Prior Publication Data

US 2004/0219741 A1 Nov. 4, 2004

Related U.S. Application Data

(62) Division of application No. 10/262,740, filed on Oct. 2, 2002.

(30) Foreign Application Priority Data

May 29, 2002 (TW) ...................................... 091111421 A

(51) Int. Cl.[7] .............................................. H01L 21/336
(52) U.S. Cl. ...................... 438/286; 257/344; 257/366; 257/408; 438/291; 438/299; 438/302; 438/303
(58) Field of Search ................................. 257/344, 366, 257/408; 438/286, 291, 299, 302, 303

(56) References Cited

U.S. PATENT DOCUMENTS

| | | | |
|---|---|---|---|
| 3,936,857 A | | 2/1976 | Ota |
| 4,613,882 A | | 9/1986 | Pimbley et al. |
| 4,680,603 A | * | 7/1987 | Wei et al. .................... 257/344 |
| 4,894,694 A | * | 1/1990 | Cham et al. ................. 257/344 |
| 5,060,033 A | | 10/1991 | Takeuchi |
| 5,223,445 A | * | 6/1993 | Fuse ........................... 438/302 |
| 5,362,982 A | * | 11/1994 | Hirase et al. ................ 257/408 |
| 5,451,807 A | * | 9/1995 | Fujita .......................... 257/404 |
| 5,965,915 A | | 10/1999 | Yamazaki et al. |
| 6,071,762 A | | 6/2000 | Wu et al. |
| 6,165,876 A | | 12/2000 | Yamazaki et al. |
| 6,211,533 B1 | | 4/2001 | Byun et al. |
| 6,281,552 B1 | | 8/2001 | Kawasaki et al. |
| 6,284,577 B1 | | 9/2001 | Suzawa et al. |
| 6,455,380 B2 | * | 9/2002 | Yoon .......................... 438/286 |
| 6,664,600 B2 | * | 12/2003 | Ahmad et al. .............. 257/366 |

FOREIGN PATENT DOCUMENTS

| | | |
|---|---|---|
| JP | 4-167564 | 6/1992 |
| JP | 4-79424 | 7/1992 |
| JP | 5-121436 | 5/1993 |
| JP | 06/0275830 | 9/1994 |
| JP | 8-51207 | 2/1996 |
| JP | 8-264784 | 10/1996 |
| JP | 9-162393 | 6/1997 |

* cited by examiner

*Primary Examiner*—David Nelms
*Assistant Examiner*—Dao H. Nguyen
(74) *Attorney, Agent, or Firm*—Volpe and Koenig, P.C.

(57) ABSTRACT

A low-temperature polysilicon thin film transistor having a buried LDD structure is provided. Two heavily doped regions are formed in a semiconductor layer and distributed just below a surface of the semiconductor layer. Two LDD regions are both sandwiched between the two heavily doped regions in a direction substantially parallel to the surface of semiconductor layer, and separated from the surface of the semiconductor layer by a portion of the semiconductor layer. The process for producing such a thin film transistor is also provided. A first, a second and a third doping materials are injected into a semiconductor layer in different directions to form heavily doped regions and LDD regions.

16 Claims, 11 Drawing Sheets

LOW-TEMPERATURE POLYSILICON THIN FILM TRANSISTOR HAVING BURIED LDD STRUCTURE AND PROCESS FOR PRODUCING SAME

CROSS REFERENCE TO RELATED APPLICATIONS

This application is a divisional of U.S. patent application Ser. No. 10/262,740, filed Oct. 2, 2002 which is incorporated by reference as if fully set forth.

FIELD OF THE INVENTION

The present invention relates to a low-temperature polysilicon thin film transistor, and more particularly to a low-temperature polysilicon thin film transistor having a buried lightly doped drain (LDD) structure. The present invention also relates to a process for producing such low-temperature polysilicon thin film transistor.

BACKGROUND OF THE INVENTION

TFTs (Thin Film Transistors) are widely used as basic electronic devices for controlling pixels of a TFT liquid crystal display (LCD). For this application, TFT units are formed on a glass substrate. Since the glass substrate is generally not heat resistant, the process for producing TFTs on the LCD glass plate should be a low-temperature manufacturing process. FIG. 1 is a schematic cross-sectional view illustrating the structure of a typical TFT, and the process for forming such TFT. First, a gate electrode 105 is formed on a glass substrate 100, and the substrate 100 and the gate electrode 105 are then covered with a gate insulator 110. Subsequently, an amorphous silicon layer 115 is formed on the gate insulator 110 to be used as a channel layer. Finally, source/drain regions 120 are formed on the amorphous silicon layer 115.

Since the glass substrate 100 is not able to sustain high temperature during the producing process, only the amorphous silicon layer 115 other than a polysilicon layer is formed in the process mentioned above. It is known that the TFT having the amorphous silicon layer 115 has electrical properties inferior to a TFT having the polysilicon layer. Recently, a TFT having a polysilicon layer was produced by a laser annealing procedure at a relatively low temperature. The laser annealing procedure is well known to those skilled in the art and will not be described in details herein. The laser annealing procedure improves electrical properties of TFT transistors and facilitates direct formation of TFTs on a glass substrate. FIG. 2 illustrates a typical low-temperature polysilicon thin film transistor (LTPS-TFT). The LTPS-TFT in FIG. 2 comprises a polysilicon layer 200, N-type regions 205, a gate insulator 210, an interlayer dielectric layer 215, a gate electrode 220 and source/drain conductive lines 225, which are all formed on a glass substrate (not shown). Since these two N-type regions 205 are heavily doped and has a short distance from the gate electrode 220, a so-called "hot electron effect" which impairs stability of the LTPS-TFT is rendered.

In order to minimize the hot electron effect, an LTPS-TFT having an LDD (lightly doped drain) structure was developed. Two examples of the processes for producing such LTPS-TFT are illustrated with reference to FIGS. 3(a) to 3(e) and FIGS. 4(a) to 4(c), respectively. In FIG. 3(a), a polysilicon layer 300 is formed on a glass substrate (not shown) by a laser annealing procedure, and then a gate insulator 310 is formed on the polysilicon layer 300. Then, a gate electrode 320 is formed on the gate insulator 310, and N-type regions 305 are formed by a first ion doping procedure with the gate electrode 320 serving as a mask. Then, the gate insulator 310 and the gate electrode 320 are covered with a dielectric layer 330, as can be seen in FIG. 3(b). In FIG. 3(c), a sidewall or spacer 335 is formed beside the gate electrode 320. Then, as shown in FIG. 3(d), LDD (lightly doped drain) regions 340 are formed just below the surface of the polysilicon layer 300 by a second ion doping procedure with the gate electrode 320 and the sidewall/spacer 335 serving as a mask. Meanwhile, heavily doped N-type regions 306 are formed, and the LDD regions 340 are disposed between and in the vicinity of these two heavily doped N-type regions 306. Finally, an interlayer dielectric layer 315 and source/drain conductive lines 325 are formed in sequence, thereby forming the LTPS-TFT having an LDD structure shown in FIG. 3(e).

FIGS. 4(a) to 4(c) illustrates another process for producing the LTPS-TFT having LDD structures. In FIG. 4(a), a polysilicon layer 400 is formed on a glass substrate (not shown), and N-type regions 405 are formed on the polysilicon layer 400 by a first ion doping procedure with a photoresist 430 serving as a mask. Then, as shown in FIG. 4(b), the photoresist 430 is removed, and a gate insulator 410 is formed on the polysilicon layer 400. A gate electrode 420 is then formed on the gate insulator 410 at a position where the photoresist 430 was formed previously, but has cross-sectional area less than that of the photoresist 430 formed in the previous step shown in FIG. 4(a). LDD regions 440 are then formed just below the surface of the polysilicon layer 400 by a second ion doping procedure. Meanwhile, the heavily doped N-type regions 406 are formed. Finally, an interlayer dielectric layer 415 and source/drain conductive lines 425 are formed in sequence, thereby forming the LTPS-TFT having an LDD structure shown in FIG. 4(c).

Since the LTPS-TFT of FIG. 3(e) or FIG. 4(c) has LDD regions just below the surface of the polysilicon layer, such structure is referred as a surface LDD structure. The ion doping procedures mentioned above can be ion implantation procedures and/or ion shower procedures. The dopants for the ion implantation procedure or the ion shower procedure can be P, As, PHx or AsHx. The LTPS-TFT having the LDD structures as shown in FIG. 3(e) or FIG. 4(c) is also referred as a gate-drain overlapped LDD (GO-LD). It is known that the valence distribution of dopants for an ion implantation procedure is controlled relatively precisely compared to an ion shower procedure. Since the doped drain region comprises lightly doped regions in addition to heavily doped regions, the electric field intensity in the vicinity of the drain regions is slightly diminished and thus the influence of the hot electron effect is reduced. However, the electric field intensity in the vicinity of the drain regions is still very strong so as to adversely affect movement of electrons in the channel between the two LDD regions. When electrons flow through the channel and in the vicinity of the LDD regions, the energy of the electrons is very high due to the strong electric field intensity in the vicinity of the LDD regions. Therefore, two undesirable effects occur. In view of the first effect, the silicon-hydrogen bonds at the interface between the gate insulator and the polysilicon layer may be cut off by such high energy so as to increase the interface state and result in inferior sub-threshold swing. In view of the second effect, electrons may be scattered into the gate insulator to generate an oxide trap state so as to cause a change of the threshold voltage and abnormal operations of electronic devices.

With the increasing demand of the quality of a low temperature polysilicon liquid crystal display (LCD), it is required to increase the size and resolution of the display. Furthermore, the circuits to be incorporated into the display are more complicated than ever. For example, the circuitry involves in one or more shift registers, level shifters, digital-to-analog converters (DACs), dynamic random access memories (DRAMs), and even operation amplifiers (OP). Accordingly, it is predicted that the channels of transistors will become narrower and narrower, and electric field intensities at the channels will be stronger and stronger. The above-described effects will be even significant.

SUMMARY OF THE INVENTION

It is an object of the present invention to provide an LTPS-TFT structure having improved sub-threshold swing by burying the LDD regions thereof into the polysilicon layer.

Another object of the present invention is to provide an LTPS-TFT structure having diminished electron-scattering effect by burying the LDD regions thereof into the polysilicon layer.

It is another object of the present invention to provide a process for producing an LTPS-TFT having a buried LLD structure and improved stability.

In accordance with an aspect of the present invention, there is provided a thin film transistor. The thin film transistor includes a semiconductor layer, an insulator layer, two heavily doped regions, two LDD regions and a gate electrode. The insulator layer is formed on the semiconductor layer. The two heavily doped regions are formed in the semiconductor layer and distributed just below a surface of the semiconductor layer. The two LDD regions are both sandwiched between the two heavily doped regions in a first direction, and between two portions of the semiconductor layer in a second direction substantially perpendicularly to the first direction. The two LDD regions are immediately adjacent to the two heavily doped regions, respectively, and have therebetween a channel region in the first direction. The gate electrode is formed on the insulator layer and over the channel region.

Generally, the first direction is substantially parallel to the surface of the semiconductor, and the second direction is substantially normal to the surface of the semiconductor. The thin film transistor further includes a dielectric layer, a source conductive line and a drain conductive line. The dielectric layer is formed on the gate electrode and the insulator layer. The source conductive line and the drain conductive line penetrate through the insulator layer and the dielectric layer to contact with the first heavily doped region and the second heavily doped region, respectively. The semiconductor layer is made of polycrystalline silicon and disposed on a glass substrate.

In an embodiment, each of the two heavily doped regions is of an N type, and each of the two LDD regions contains a doping material selected from a group consisting of P ions, As ions, PHx ions and AsHx ions. In another embodiment, each of the two LDD regions has more than one doping material selected from a group consisting of P ions, As ions, PHx ions and AsHx ions, and has gradual dopant distributions.

In accordance with another aspect of the present invention, there is provided a process for producing a thin film transistor having a buried LDD structure. An insulator layer is formed on the semiconductor layer, and then a gate electrode on the insulator layer. Then, a first doping material is injected into the semiconductor layer in a first direction normal to the surface of the semiconductor layer to form a first doped region. A second doping material is injected into the semiconductor layer in a second direction deviating from the first direction by a first angle to form a second doped region. Finally, a third doping material is injected into the semiconductor layer in a third direction deviating from the first direction by a second angle to form a third doped region. In such way, the second and the third doped regions partially overlap the first doped region, respectively.

In an embodiment, the process further comprises a step of forming sidewalls beside the gate electrode. The injection step of the first doping material is performed after the forming step of the sidewalls. The injection step of the first doping material is performed after the forming step of the gate electrode. Each of the injection steps of the first, second and third doping material is implemented by one of an ion implantation procedure and an ion shower procedure.

Preferably, each of the first, second and third doping material is ions elected from a group consisting of P ions, As ions, PHx ions and AsHx ions. In an embodiment, each of the second doping material and the third doping material comprises at least two kinds of ions selected from a group consisting of P ions, As ions, PHx ions and AsHx ions.

Preferably, the second direction and the third direction are substantially symmetric with respect of the first direction. More preferably, each of the first angle and the second angle is greater than 0° and no greater than 30°.

In accordance with another aspect of the present invention, there is provided a process for forming a buried LDD structure of a thin film transistor. The process includes steps of providing a semiconductor layer, providing a doping mask on the semiconductor layer, injecting a first doping material into the semiconductor layer in a first direction normal to a surface of the semiconductor layer to form a first doped region, injecting a second doping material into the semiconductor layer in a second direction having a first incline angle with respect to the first direction to form a second doped region partially overlapping the first doped region, and injecting a third doping material into the semiconductor layer in a third direction having a second incline angle with respect to the first direction to form a third doped region partially overlapping the first doped region.

In an embodiment, the doping mask is made of a material of a photoresist. The process further comprises steps of removing the doping mask, forming an insulator layer on the surface of the semiconductor layer, and forming a gate electrode on the insulator layer at a position corresponding to the doping mask. The injection step of the first doping material is performed before the removing step of the doping mask, and the injection step of the second doping material is performed after the forming step of the gate electrode.

In another embodiment, the doping mask is a gate electrode of the thin film transistor. No additional doping mask is required in this embodiment.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
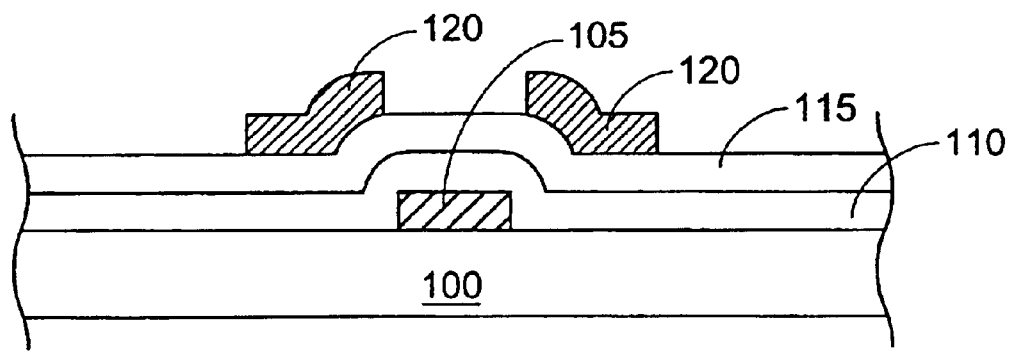
FIG. 1 is a schematic cross-sectional view illustrating a typical thin film transistor.
Figure 2:
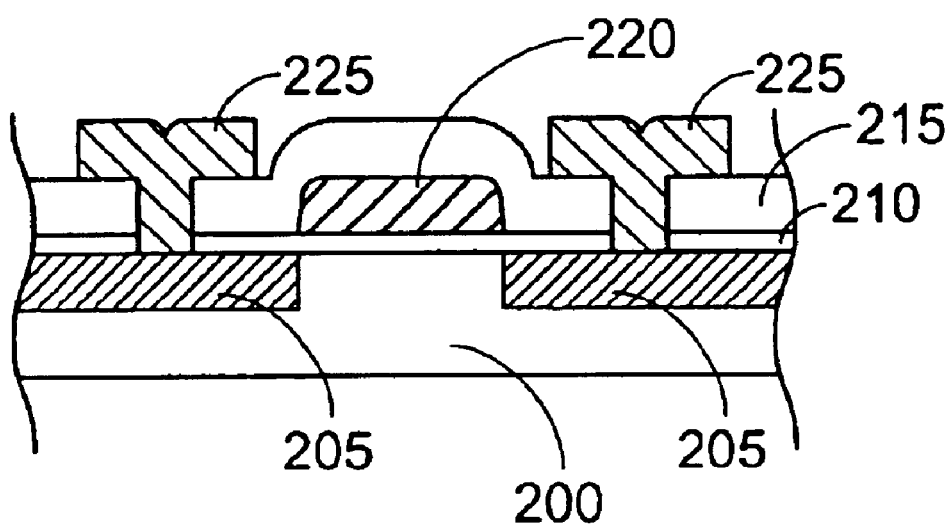
FIG. 2 is a schematic cross-sectional view illustrating a typical LTPS-TFT.
Figure 3A:
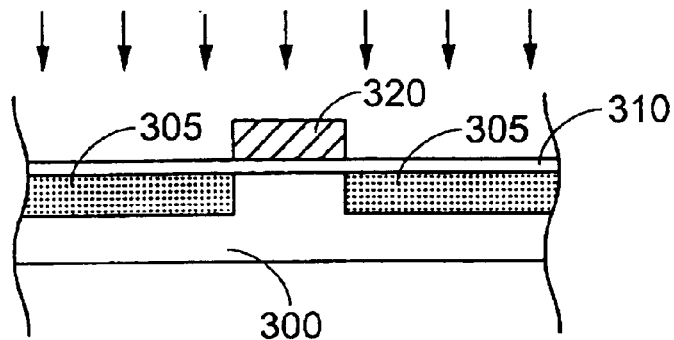
FIGS. 3(a) to 3(e) are schematic cross-sectional views illustrating a conventional process for producing an LTPS-TFT having a superficial LDD structure.
Figure 3B:
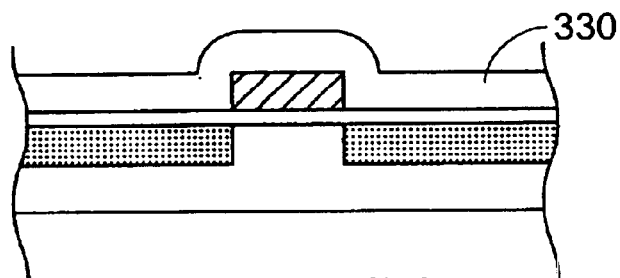
Figure 3C:
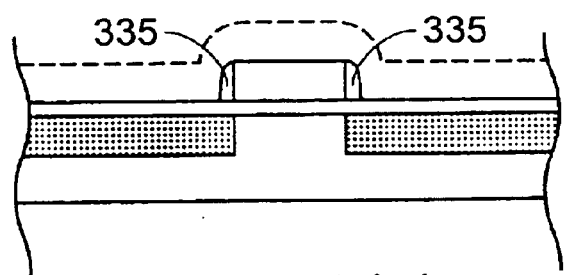
Figure 3D:
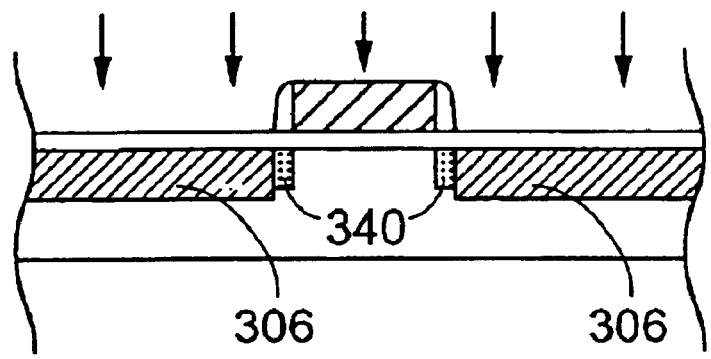
Figure 3E:
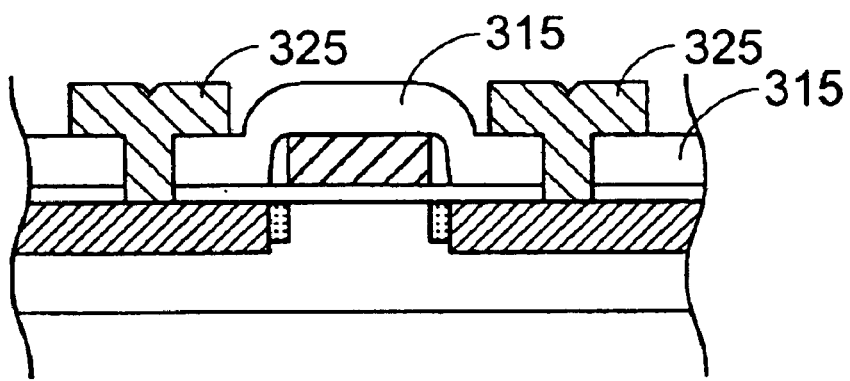
Figure 4A:
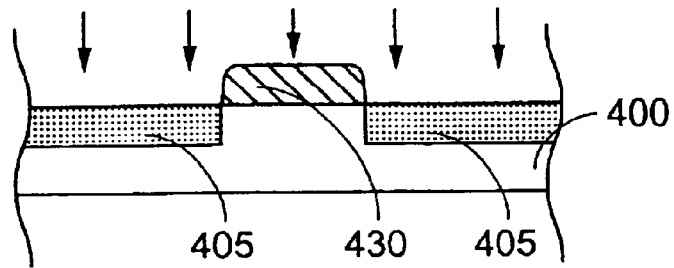
FIGS. 4(a) to 4(c) are schematic cross-sectional views illustrating another conventional process for producing an LTPS-TFT having a superficial LDD structure.
Figure 4B:
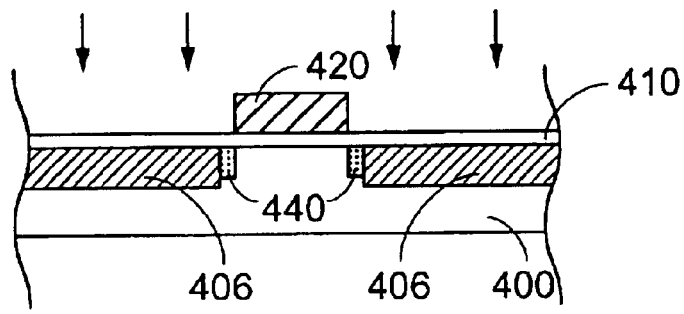
Figure 4C:
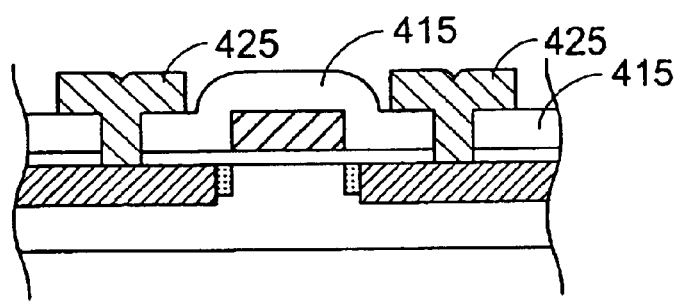
Figure 5A:
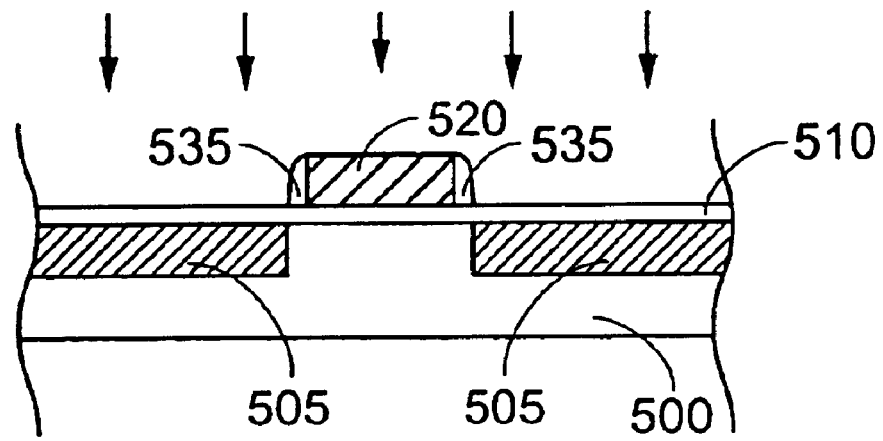
FIGS. 5(a) to 5(d) are schematic cross-sectional views illustrating a process for producing an LTPS-TFT having a buried LDD structure according to a preferred embodiment of the present invention.
Figure 5B:
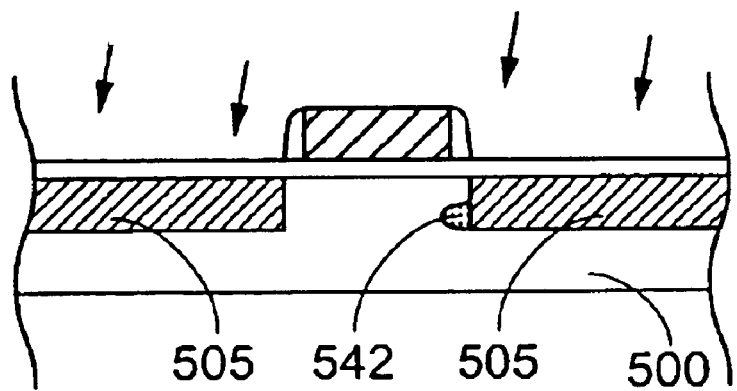
Figure 5C:
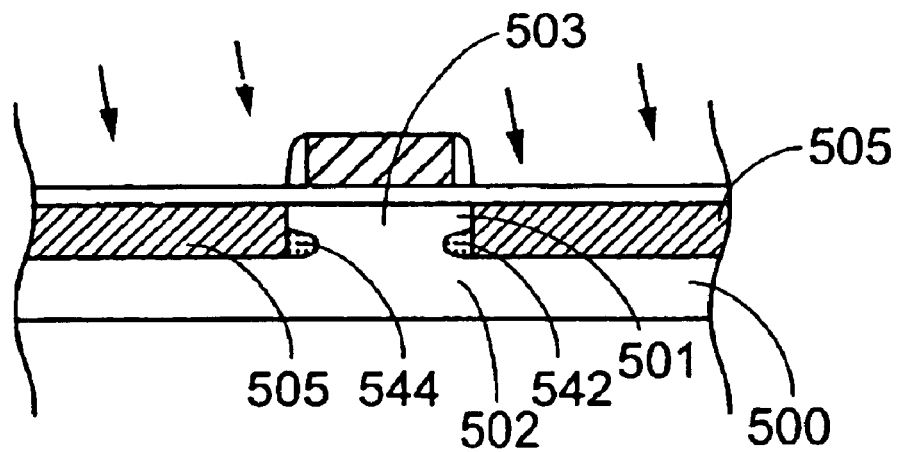
Figure 5D:
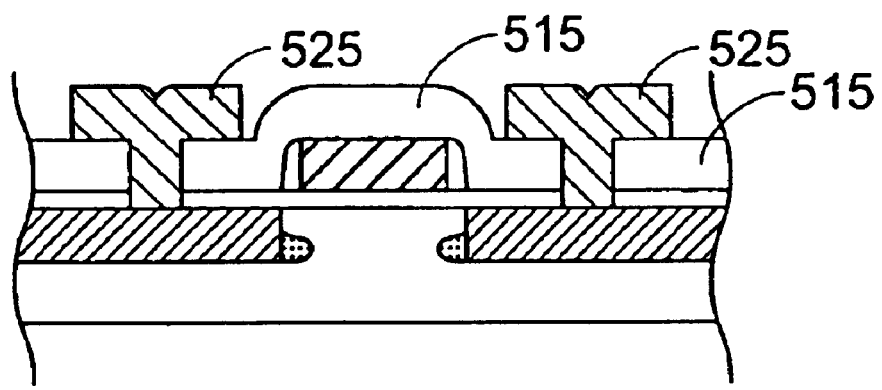

Please refer to FIGS. 5(a) to 5(d), which illustrate steps for producing an LTPS-TFT having a buried LDD structure according to the present invention. In FIG. 5(a), a polysilicon layer 500 is formed on a glass substrate (not shown) by a laser annealing procedure, and then a gate insulator 510 is formed on the polysilicon layer 500. Then, a gate electrode 520 is formed on the gate insulator 510, and sidewalls or spacers 535 are formed beside the gate electrode 520. With the gate electrode 520 and the sidewalls 535 serving as a doping mask, an N-type doping material, for example P ions, As ions, PHx ions and/or AsHx ions, is injected into the polysilicon layer 500 in a first direction normal to a surface of the polysilicon layer 500 by a first ion doping procedure, thereby forming N-type regions 505 just below the surface of the polysilicon layer 500. As shown in FIGS. 5(b) and 5(c), also with the gate electrode 520 and the sidewalls 535 serving as a doping mask, two successive doping procedures are performed to inject doping materials such as P ions, As ions, PHx ions and/or AsHx ions into the polysilicon layer 500 in a second direction and a third direction deviating from the first direction by a first angle and a second angle, respectively, to form source/drain electrodes in the N-type regions 505 and a first and a second LDD regions 542 and 544. The slantingly doping procedures result in that the LDD regions 542 and 544 are formed next to the source/drain electrodes 505 and buried in the polysilicon layer 500. In other words, there are polysilicon portions 501 and 502 existent above and below the LDD region 542 or 544. The portion 501 isolates the interface between the gate insulator 510 and the polysilicon layer 500 from a channel 503 between the first LDD region 542 and the second LDD region 544, thereby avoiding the silicon-hydrogen bonds at the interface between the gate insulator 510 and the polysilicon layer 500 being cut off by high electron energy, and minimize the scattering of electrons into the gate insulator 510. Therefore, the sub-threshold swing shift and the oxide trap state are diminished, and the threshold voltage is stabilized. In this embodiment, the second direction and the third direction are preferably symmetric with respect of the first direction so as to unify the concentrations of dopants in source and drain regions. For example, each of the first angle and the second angle can be made equal and ranged between 0° and 30°. Finally, an interlayer dielectric layer 515 and source/drain conductive lines 525 are formed in sequence, thereby forming the LTPS-TFT having a buried LDD structure shown in FIG. 5(d).

Figure 6:
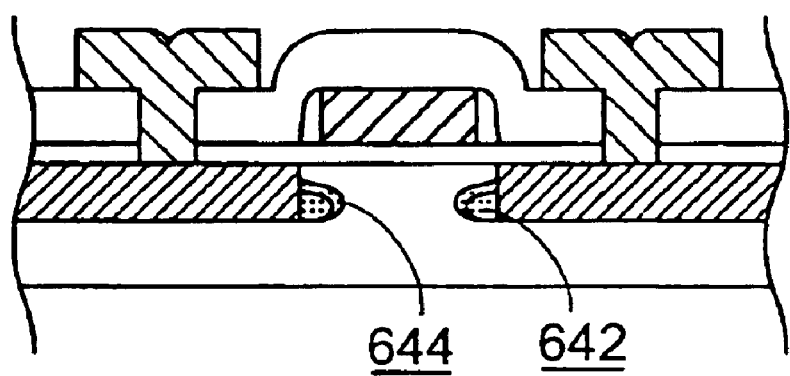
FIG. 6 is a schematic cross-sectional view illustrating an embodiment of an LTPS-TFT having a buried LDD structure of gradual dopant distributions according to the present invention.

According to the present invention, the first, second and third ion doping procedures can be in any sequence for the purpose of forming the buried structure of an LTPS-TFT. In addition, the buried LDD structure may consist of more than one doping material, for example two kinds of doping material, such as $PH_3$ ions and $AsH_3$ ions. Due to a difference between the molecular weights of the two dopants, the LDD regions 642 and 644 are formed with gradual dopant distributions, as can be seen in FIG. 6.

Figure 7A:
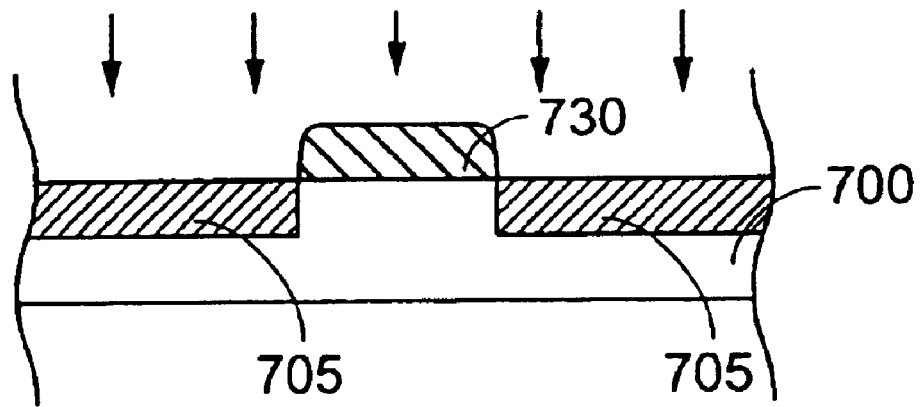
FIGS. 7(a) to 7(d) are schematic cross-sectional views illustrating another process for producing an LTPS-TFT having a buried LDD structure according to another preferred embodiment of the present invention.
Figure 7B:
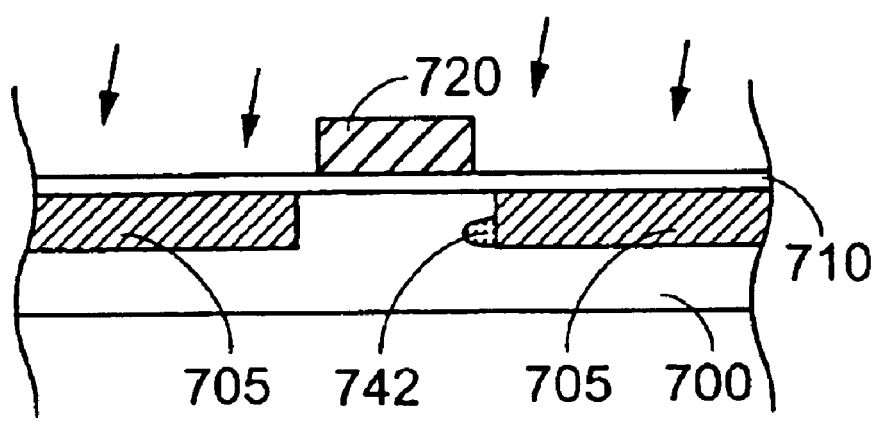
Figure 7C:
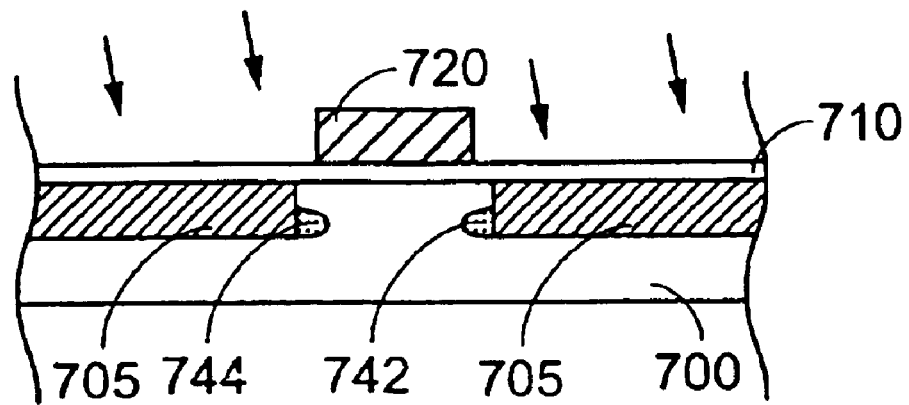
Figure 7D:
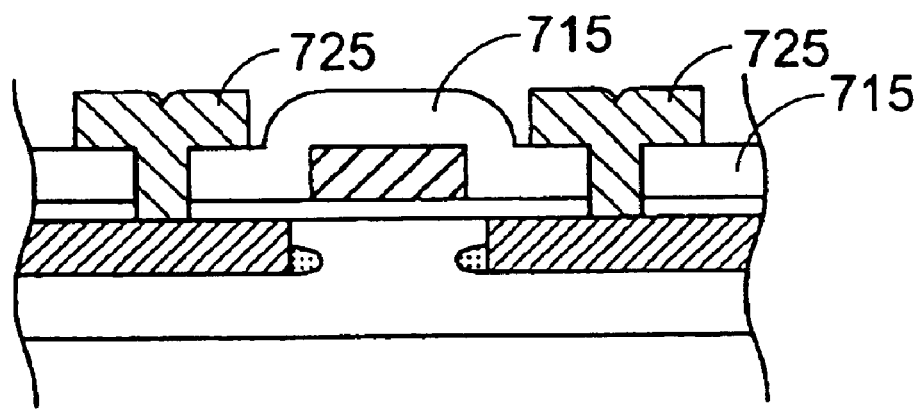

FIGS. 7(a) to 7(d) illustrates another process for producing the LTPS-TFT having a buried LDD structure. In FIG. 7(a), a polysilicon layer 700 is formed on a glass substrate (not shown). With a photoresist 730 serving as a mask, an N-type doping material is injected into the polysilicon layer 700 in a first direction normal to a surface of the polysilicon layer 700 by a first ion doping procedure with energy of about 10 keV and dose of about $10^{15}$ cm$^{-2}$, thereby forming N-type regions 705 just below the surface of the polysilicon layer 700. Then, as shown in FIG. 7(b), the photoresist 730 is removed, and a gate insulator 710 is formed on the polysilicon layer 700. A gate electrode 720 is then formed on the gate insulator 710 at a position where the photoresist 730 was formed previously in the step shown in FIG. 7(a). Then, a second ion doping procedure with energy of about 50~110 keV and dose of about $5×10^{12}$~$1×10^{14}$ cm$^{-2}$ is performed to inject a doping material into the polysilicon layer 700 in a second direction deviating from the first direction by a first angle, thereby forming a first LDD region 742. As shown in FIG. 7(c), a third ion doping procedure with energy and dose similar to the second ion doping procedure is performed to inject a doping material into the polysilicon layer 700 in a third direction deviating from the first direction by a second angle, thereby forming a second LDD region 744. Therefore, a channel is formed between the first LDD region 742 and the second LDD region 744. Finally, an interlayer dielectric layer 715 and source/drain conductive lines 725 are formed in sequence, thereby forming the LTPS-TFT having a buried LDD structure shown in FIG. 7(d). By declining the injection angles and properly selecting the doping energy and dose in the second and third ion doping procedures, the LDD regions 742 and 744 are arranged with a proper clearance from the interface between the gate insulator 710 and the polysilicon layer 700, thereby stabilizing the operation of the electronic device.

Figure 8:
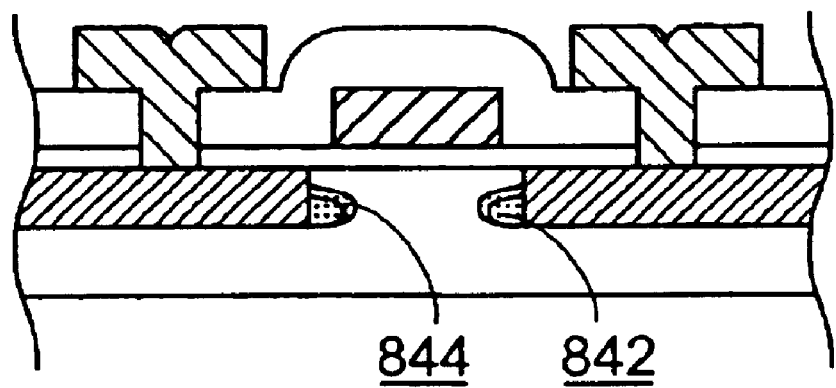
FIG. 8 is a schematic cross-sectional view illustrating another embodiment of an LTPS-TFT having a buried LDD structure of gradual dopant distributions according to the present invention.

It is of course that the first, second and third ion doping procedures can be in any sequence for the purpose of forming the buried structure of an LTPS-TFT. In addition, the buried LDD structure can be formed of at least two kinds of doping materials, for example $PH_3$ ions and $AsH_3$ ions, and has gradual dopant distributions, as can be seen in FIG. 8.

The ion doping procedures mentioned above, for example, can be ion implantation procedures and/or ion shower procedures. Furthermore, the gate conductor in this embodiment is formed by sputtering with chromium, tungsten molybdenum, tantalum, aluminum or copper and has a thickness of about 200 nm. An amorphous silicon layer having a thickness of about 50 nm is employed to form the polysilicon layer in the above embodiments by a laser annealing/crystallizing procedure. Preferably, the amorphous silicon layer needs to be dehydrogenated for 30 min in a high temperature furnace at 400° C. prior to the laser annealing/crystallizing procedure. During the laser annealing/crystallizing procedure, the energy for carrying out the laser annealing/crystallizing procedure is selected such that at least 100 shots are provided at 400 mJ/cm$^2$. The gate insulator used in the above embodiment generally has a thickness of about 100 nm and is formed with silicon dioxide by a plasma enhanced chemical vapor deposition (PECVD) procedure.

According to the present invention, since the LDD regions are buried in the polysilicon layer, the moving path of the electron is distant from the interface between the polysilicon layer and the gate insulator. It is found that the silicon-hydrogen bonds at the interface between the polysilicon layer and the gate insulator can be prevented from cutting off by the hot electrons. In addition, the electrons are hard to be scattered into the gate insulator to generate an oxide trap state. Therefore, an LTPS-TFT with good sub-threshold swing and stable threshold voltage is produced to meet the increasing demand of LCD quality.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for producing a thin film transistor having a buried lightly doped drain (LDD) structure, said process comprising:

providing a semiconductor layer;

forming an insulator layer on a surface of said semiconductor layer;

forming a gate electrode on said insulator layer;

injecting a first doping material into said semiconductor layer in a first direction normal to said surface of said semiconductor layer to form a first doped region; and injecting a second doping material into said semiconductor layer in a second direction deviating from said first direction by a first angle to form a second doped region which is located entirely at least a certain distance below said surface of said semiconductor layer and is located entirely under an un-doped region of said semiconductor layer.

2. The process according to claim 1 further comprising a step of forming sidewalls beside said gate electrode.

3. The process according to claim 2 wherein the injection step of said first doping material is performed after the forming step of said sidewalls.

4. The process according to claim 1 wherein the injection step of said first doping material is performed after the forming step of said gate electrode.

5. The process according to claim 1 further comprising a step of injecting a third doping material into said semiconductor layer in a third direction deviating from said first direction by a second angle to form a third doped region which is located entirely at least a certain distance below said surface of said semiconductor layer and is located entirely under an un-doped rejoin of said semiconductor layer.

6. The process according to claim 5 wherein each of said first, second and third doping materials is selected from a group consisting of P ions, As ions, PHx ions and AsHx ions.

7. The process according to claim 5 wherein each of said second and third doping materials comprises at least two kinds of ions selected from a group consisting of P ions, As ions, PHx ions and AsHx ions.

8. The process according to claim 5 wherein said second and third directions are substantially symmetric with respect of said first direction.

9. The process according to claim 5 wherein each of said first and second angles is greater than 0° and no greater than 30°.

10. A process for forming a buried lightly doped drain (LDD) structure of a thin film transistor, said process comprising:

providing a semiconductor layer;

providing a doping mask over a surface of said semiconductor layer;

injecting a first doping material into said semiconductor layer in a first direction normal to said surface of said semiconductor layer to form a first doped region; and injecting a second doping material into said semiconductor layer in a second direction having a first incline angle with respect to said first direction to form a second doped region which is located entirely at least a certain distance below said surface of said semiconductor layer and is located entirely under an un-doped region of said semiconductor layer.

11. The process according to claim 10 wherein said doping mask is made of a material of a photoresist, and said process further comprises:

removing said doping mask;

forming an insulator layer on said surface of said semiconductor layer; and forming a gate electrode on said insulator layer at a position corresponding to said doping mask.

12. The process according to claim 11 wherein the injection step of said first doping material is performed before the removing step of said doping mask, and the injection step of said second doping material is performed after the forming step of said gate electrode.

13. The process according to claim 10 wherein said doping mask is a gate electrode of said thin film transistor.

14. The process according to claim 10 wherein said first doping material is injected into said semiconductor layer with energy of about 10 keV and dose of about $10^{15}$ cm$^{-2}$, and said second doping material is injected into said semiconductor layer with energy of about 50~110 keV and dose of about $5 \times 10^{12}$~$1 \times 10^{14}$ cm$^{-2}$.

15. The process according to claim 10 further comprising a step of injecting a third doping material into said semiconductor layer in a third direction having a second incline angle with respect to said first direction to form a third doped region which is located entirely at least a certain distance below said surface of said semiconductor layer and located entirely under an un-doped region of said semiconductor layer.

16. The process according to claim 15 wherein said first doping material is injected into said semiconductor layer with energy of about 10 keV and dose of about $10^{15}$ cm$^{-2}$, and said second and third doping materials are injected into said semiconductor layer with energy of about 50~110 keV and dose of about $5 \times 10^{12}$~$1 \times 10^{14}$ cm$^{-2}$.

* * * * *